(12) United States Patent
Cheng et al.

(10) Patent No.: US 8,367,945 B2
(45) Date of Patent: Feb. 5, 2013

(54) APPARATUS, SYSTEM AND METHOD FOR USE IN MOUNTING ELECTRONIC ELEMENTS

(75) Inventors: Siu Cheong Cheng, Hong Kong (CN); Jian Hui Xie, Guangdong (CN)

(73) Assignee: Cree Huizhou Opto Limited, Huizhou Municipality, Guangdong Province (CN)

( * ) Notice: Subject to any disclaimer, the term of this patent is extended or adjusted under 35 U.S.C. 154(b) by 0 days.

(21) Appl. No.: 11/465,120

(22) Filed: Aug. 16, 2006

(65) Prior Publication Data
US 2008/0041625 A1 Feb. 21, 2008

(51) Int. Cl.
*H01L 23/495* (2006.01)
(52) U.S. Cl. .......................................... 174/536; 257/98
(58) Field of Classification Search ................... 174/520, 174/536; 257/98
See application file for complete search history.

(56) References Cited

U.S. PATENT DOCUMENTS

| | | | | |
|---|---|---|---|---|
| 3,760,237 A | 9/1973 | Jaffe | ................. | 257/98 |
| 4,307,297 A | 12/1981 | Groff | | |
| 4,511,425 A | 4/1985 | Boyd | ............... | 156/493 |
| 5,040,868 A | 8/1991 | Waitl | | |
| 5,122,943 A | 6/1992 | Pugh | ................ | 362/256 |
| 5,130,761 A | 7/1992 | Tanaka | ............. | 357/17 |
| 5,167,556 A | 12/1992 | Stein | | |
| 5,351,106 A | 9/1994 | Lesko | ............... | 355/83 |
| 5,703,401 A | 12/1997 | Van de Water | | |
| 5,706,177 A | 1/1998 | Nather | | |
| 5,731,547 A | 3/1998 | Derwin et al. | ................ | 174/251 |
| 5,790,298 A | 8/1998 | Tonar | .............. | 359/267 |
| 5,813,753 A | 9/1998 | Vriens et al. | ................... | 362/293 |
| 5,907,151 A | 5/1999 | Gramann | | |
| 5,959,316 A | 9/1999 | Lowery | ............................ | 257/98 |
| 6,061,160 A | 5/2000 | Maruyama | ..................... | 359/152 |
| 6,066,861 A | 5/2000 | Hohn et al. | | |
| 6,183,100 B1 | 2/2001 | Suckow et al. | ................. | 362/35 |
| 6,224,216 B1 | 5/2001 | Parker et al. | ...................... | 353/31 |
| 6,259,608 B1 | 7/2001 | Berardinelli et al. | | |
| 6,274,924 B1 | 8/2001 | Carey et al. | .................... | 257/676 |
| 6,296,367 B1 * | 10/2001 | Parsons et al. | ................ | 362/183 |
| 6,359,236 B1 | 3/2002 | DiStefano et al. | | |
| 6,376,902 B1 | 4/2002 | Arndt | ............................ | 257/678 |

(Continued)

FOREIGN PATENT DOCUMENTS

| CN | 2498694 | | 7/2002 |
|---|---|---|---|
| CN | 2617039 | Y | 5/2004 |

(Continued)

OTHER PUBLICATIONS

JP 2001 060072A, Abstract, Matsushita Electric Ind. Co Ltd., Mar. 6, 2001.

(Continued)

*Primary Examiner* — Hung Ngo
(74) *Attorney, Agent, or Firm* — Koppel, Patrick, Heybl & Philpott

(57) ABSTRACT

The present embodiments provide apparatuses, systems and methods of manufacturing surface mountable devices. Some embodiments provide surface mount devices that comprise a casing comprising a recess formed in the casing and extending into the casing, an insert secured with the casing and extending about the recess defining a portion of a surface of the recess with the insert comprising a reflective surface exposed along the recess, and a plurality of leads partially exposed through the recess.

17 Claims, 11 Drawing Sheets

U.S. PATENT DOCUMENTS

| | | | |
|---|---|---|---|
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima | |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. | 313/496 |
| 6,624,491 B2 | 9/2003 | Waitl et al. | |
| 6,680,490 B2 | 1/2004 | Yasukawa et al. | |
| 6,686,580 B1 | 2/2004 | Glenn et al. | 250/208.1 |
| 6,686,609 B1 | 2/2004 | Sung | |
| 6,707,069 B2 | 3/2004 | Song et al. | 257/79 |
| 6,710,373 B2 | 3/2004 | Wang | |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,791,259 B1 | 9/2004 | Stokes | |
| 6,809,342 B2 | 10/2004 | Mitsunori | 257/79 |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,940,704 B2 | 9/2005 | Stalions | |
| 6,946,714 B2 | 9/2005 | Waitl | |
| 6,975,011 B2 | 12/2005 | Arndt | |
| 6,995,510 B2 | 2/2006 | Murakami et al. | |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | |
| 7,102,213 B2 | 9/2006 | Sorg | |
| 7,119,422 B2 | 10/2006 | Chin | 257/666 |
| 7,161,189 B2 | 1/2007 | Wu | 57/98 |
| 7,187,009 B2 | 3/2007 | Fukasawa et al. | 257/98 |
| 7,224,000 B2 | 5/2007 | Aanegola et al. | 257/98 |
| 7,244,965 B2 | 7/2007 | Andrews et al. | 257/98 |
| 7,282,740 B2 * | 10/2007 | Chikugawa et al. | 257/79 |
| 7,285,802 B2 | 10/2007 | Ouderkirk et al. | 257/98 |
| 7,303,315 B2 | 12/2007 | Ouderkirk et al. | 362/294 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 | 9/2008 | Oyama et al. | 257/98 |
| 7,439,667 B2 | 10/2008 | Ohtani | 313/500 |
| 7,622,795 B2 | 11/2009 | Chiang | 257/675 |
| 7,635,915 B2 | 12/2009 | Xie et al. | 25/692 |
| 7,692,206 B2 * | 4/2010 | Loh | 257/99 |
| 7,777,412 B2 | 8/2010 | Pang | 313/506 |
| 7,841,747 B2 * | 11/2010 | Oon et al. | 362/296.01 |
| 7,847,302 B2 | 12/2010 | Basin et al. | 257/88 |
| 8,217,414 B2 | 7/2012 | Hayashi | 257/99 |
| 2002/0021085 A1 | 2/2002 | Ng | |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager | |
| 2003/0116769 A1 | 6/2003 | Song et al. | |
| 2003/0160256 A1 | 8/2003 | Durocher et al. | |
| 2003/0183852 A1 | 10/2003 | Takenaka | |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0217364 A1 | 11/2004 | Tarsa | |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0256706 A1 * | 12/2004 | Nakashima | 257/678 |
| 2005/0023548 A1 | 2/2005 | Bhat | |
| 2005/0072981 A1 | 4/2005 | Suenaga | |
| 2005/0077535 A1 | 4/2005 | Li | |
| 2005/0093005 A1 | 5/2005 | Ruhnau | |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa | |
| 2005/0179041 A1 | 8/2005 | Harbers et al. | |
| 2005/0179376 A1 | 8/2005 | Fung et al. | |
| 2006/0022212 A1 | 2/2006 | Waitl | |
| 2006/0049477 A1 | 3/2006 | Arndt | |
| 2006/0091406 A1 | 5/2006 | Kaneko et al. | |
| 2006/0102917 A1 * | 5/2006 | Oyama et al. | 257/99 |
| 2006/0108594 A1 | 5/2006 | Iwasaki et al. | |
| 2006/0133044 A1 | 6/2006 | Kim et al. | |
| 2006/0157828 A1 | 7/2006 | Sorg | |
| 2006/0220046 A1 | 10/2006 | Yu et al. | |
| 2006/0255355 A1 * | 11/2006 | Brunner et al. | 257/98 |
| 2007/0046176 A1 | 3/2007 | Bukesov et al. | |
| 2007/0109779 A1 | 5/2007 | Sekiguchi et al. | |
| 2007/0170449 A1 | 7/2007 | Anandan | |
| 2007/0269586 A1 * | 11/2007 | Leatherdale et al. | 427/66 |
| 2008/0013319 A1 | 1/2008 | Pei et al. | |
| 2008/0074032 A1 | 3/2008 | Yano et al. | |
| 2008/0121921 A1 | 5/2008 | Loh et al. | |
| 2008/0170391 A1 * | 7/2008 | Norfidathul et al. | 362/227 |
| 2008/0186702 A1 | 8/2008 | Camras et al. | |
| 2008/0191232 A1 | 8/2008 | Lee et al. | |
| 2008/0258156 A1 | 10/2008 | Hata | 257/88 |
| 2008/0296590 A1 | 12/2008 | Ng | |
| 2008/0298063 A1 | 12/2008 | Hayashi | 362/249 |
| 2008/0303052 A1 | 12/2008 | Lee et al. | |
| 2008/0308825 A1 | 12/2008 | Chakraborty | |
| 2009/0050908 A1 | 2/2009 | Yuan et al. | |
| 2009/0050911 A1 | 2/2009 | Chakraborty | |
| 2009/0057699 A1 | 3/2009 | Basin | |
| 2009/0057708 A1 | 3/2009 | Karim et al. | 257/100 |
| 2009/0072251 A1 | 3/2009 | Chan et al. | 257/88 |
| 2009/0129085 A1 | 5/2009 | Aizar et al. | 362/247 |
| 2009/0189178 A1 | 7/2009 | Kim et al. | |
| 2009/0236618 A1 | 9/2009 | Yasuda | 257/88 |
| 2009/0283781 A1 | 11/2009 | Chan et al. | |
| 2010/0103660 A1 | 4/2010 | Van de Ven et al. | 362/231 |
| 2011/0049545 A1 | 3/2011 | Basin et al. | |

FOREIGN PATENT DOCUMENTS

| | | |
|---|---|---|
| CN | 2646873 | 10/2004 |
| CN | 1581527 A | 2/2005 |
| CN | 1679168 A | 5/2005 |
| CN | 1591924 A | 9/2005 |
| CN | 1744335 A | 3/2006 |
| CN | 1801498 A | 7/2006 |
| CN | 1977399 A | 6/2007 |
| CN | 101061590 A | 10/2007 |
| CN | 101360368 | 2/2009 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1 953 834 A1 | 8/2008 |
| GB | 2420221 A | 12/2004 |
| GB | 2420221 A | 5/2006 |
| GB | 2 458 972 A | 10/2009 |
| JP | 53-118019 | 10/1978 |
| JP | 59-027559 A | 2/1984 |
| JP | 59027559 | 2/1984 |
| JP | 61-048951 A | 3/1986 |
| JP | 61048951 | 3/1986 |
| JP | 03-171780 | 7/1991 |
| JP | 06-177424 | 6/1994 |
| JP | 7-202271 | 8/1995 |
| JP | 8139257 | 5/1996 |
| JP | 11008405 | 1/1999 |
| JP | 11-054802 | 2/1999 |
| JP | 11-167805 A | 6/1999 |

| | | |
|---|---|---|
| JP | 11150306 | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2001-168400 | 6/2001 |
| JP | 2001518692 | 10/2001 |
| JP | 2002-223005 | 8/2002 |
| JP | 2003-197974 | 7/2003 |
| JP | 2003-264267 | 9/2003 |
| JP | 2004-111937 A | 4/2004 |
| JP | 2004-200236 | 7/2004 |
| JP | 2005-019838 A | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2006509372 A | 3/2006 |
| JP | 2006-119357 | 5/2006 |
| JP | 2006-324331 | 11/2006 |
| JP | 2007-094088 | 4/2007 |
| JP | 2007-165029 | 6/2007 |
| JP | 2007-273763 | 10/2007 |
| JP | 2007-287981 | 11/2007 |
| JP | 2007-299905 | 11/2007 |
| WO | WO 9931737 | 6/1999 |
| WO | WO0217405 | 2/2002 |
| WO | WO2004027882 | 4/2004 |
| WO | WO2004044877 | 5/2004 |
| WO | WO 2004/053933 A2 | 6/2004 |
| WO | WO2005104247 | 3/2005 |
| WO | WO2005043627 A1 | 5/2005 |
| WO | WO2006054228 A2 | 5/2006 |
| WO | WO2006054228 A3 | 5/2006 |
| WO | WO 2007/083408 A1 | 7/2007 |
| WO | WO2007/127029 A2 | 11/2007 |
| WO | WO2008081696 | 7/2008 |
| WO | WO 2009/074919 A1 | 6/2009 |

OTHER PUBLICATIONS

Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-002857, dated: Apr. 24, 2009, pp. 1-2.
Official Notice of Decision for Refusal regarding related Japanese Design Application No. 2009-002857, dated Nov. 17, 2009.
Preliminary Notice of Reasons for Refusal re related Japanese Application No. 2009-002857, dated: Jul. 24, 2009.
Office Action from related China Application No. 200710142310.7, dated Dec. 11, 2009.
Declaration of Gerald Negley under 37 C.F.R.§ 1.132, dated: Aug. 20, 2009.
Declaration of Charles Swoboda under 37 C.F.R.§ 1.132, dated: Aug. 19, 2009.
International Search Report for PCT/CN2009/074800 mailed Feb. 25, 2010.
Office Action from U.S. Appl. No. 11/149,998. dated: Nov. 20, 2009.
Response to Office Action from U.S. Appl. No. 11/149.998. dated: Feb. 22, 2010.
Office Action from U.S. Appl. No. 12/154.691. dated: Dec. 17, 2009.
Response to Office Action from U.S. Appl. No. 12/154.691. dated: May 17, 2010.
Office Action from U.S. Appl. No. 12/152.766. dated: Mar. 12, 2010.
Office Action from U.S. Appl. No. 12/069,827. dated: Apr. 20, 2010.
Office Action from U.S. Appl. No. 12/321.059. dated: May 17, 2010.
Office Action from U.S. Appl. No. 11/149.998, dated: May 18, 2010.
First Office Action for Chinese Patent Application No. 200780019643.9 dated Mar. 29, 2010.
Appeal Decision in Japanese Design Patent Application No. 2009-002857 (Appeal No. 2010-002154) mailed Aug. 20, 2010.
Notification of First Office Action from Chinese Patent Application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Cree® KLAMP® MC-E LEDS Product Info Sheets, pp. 1-3.
Nichia Corporation LEDS, Models NSSM016G, NSSM227, NESM026X, NSSM026BB, NESM005A, 9 Pages.
Notice of Reasons for Rejection for counterpart Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action for Chinese Patent Application No. CN 200710152109.7 issued Jul. 29, 2011.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.

Office Action in related U.S. Appl. No. 12/154,691, dated: Dec. 17, 2009.
Response to OA in related Patent Appl. No. 12/154,691, dated: Dec. 17, 2009, Response filed: May 17, 2010.
Office Action in related U.S. Appl. No. 12/321,059, dated: May 17, 2010.
Office Action from U.S. Appl. No. 12/291.293. dated: Jul. 19, 2011.
Response to Office Action from U.S. Appl. No. 12/291.293, filed Oct. 19, 2011.
Office Action from U.S. Appl. No. 12/069,827, dated: Jun. 16, 2011.
Response to Office Action from U.S. Appl. No. 12/069.827, filed Aug. 3, 2011.
Office Action from U.S. Appl. No. 12/321,059, dated: Jun. 22, 2011.
Response to Office Action from U.S. Appl. No. 12/321.059, filed Aug. 22, 2011.
Office Action from U.S. Appl. No. 12/321,059. dated:Aug. 26, 2011.
Response to Office Action from U.S. Appl. No. 12/321,059, filed Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998. dated: Sep. 21, 2011.
Office Action from U.S. Appl. No. 12/321,059, dated: Oct. 4, 2011.
Notification of the First Office Action from Chinese Patent Application No. 201010167346.2, dated Feb. 29, 2012.
Decision of Rejection for Japanese Patent Application No. 2007-211901: dated: Jan. 30, 2012.
Extended Supplementary European Search Report for application No. EP 07789665.2 dated Nov. 7, 2011.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Notice of Reasons for Rejection from Japanese Patent Application No. 2009-507195. dated May 8, 2012.
First Office Action for Chinese Patent Application No. 200980153995.2, dated May 4, 2012.
First Office Action for Chinese Patent Application No. 200910145412.3, dated Apr. 28, 2012.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
First Office Action from Chinese Patent No. 201220122011.3. dated Aug. 10, 2012.
First Office Action from Chinese Patent Application No. 201080001658.4, dated Sep. 24, 2012.
Office Action from U.S. Appl. No. 12/069,827, mailed: Aug. 9, 2012.
Office Action from U.S. Appl. No. 12/875,873, mailed: Aug. 22, 2012.
Office Action from U.S. Appl. No. 12/868,567, mailed: Sep. 12, 2012.
Office Action from U.S. Appl. No. 11/982,275, mailed: Sep. 18, 2012.
Office Action from U.S. Appl. No. 12/002,410, mailed: Sep. 25, 2012.

* cited by examiner

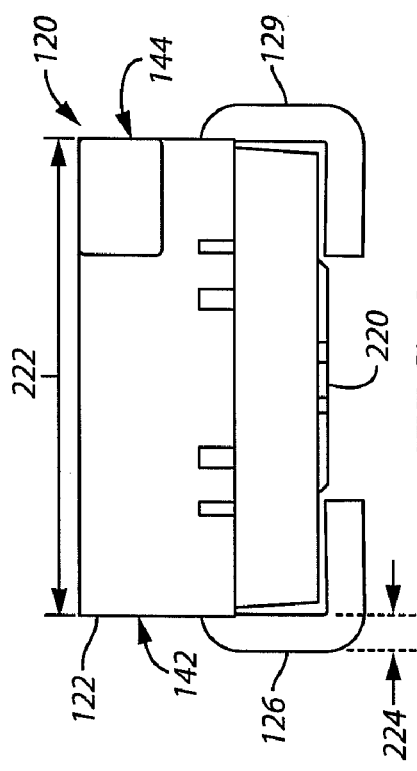
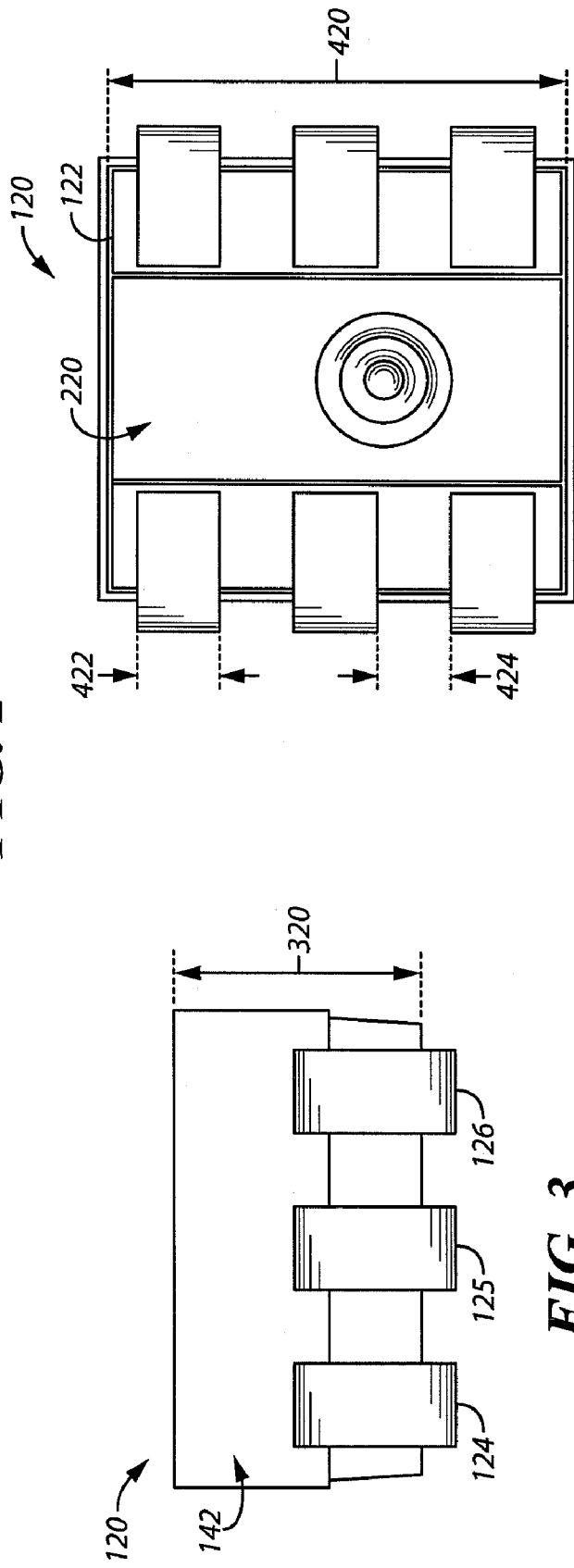

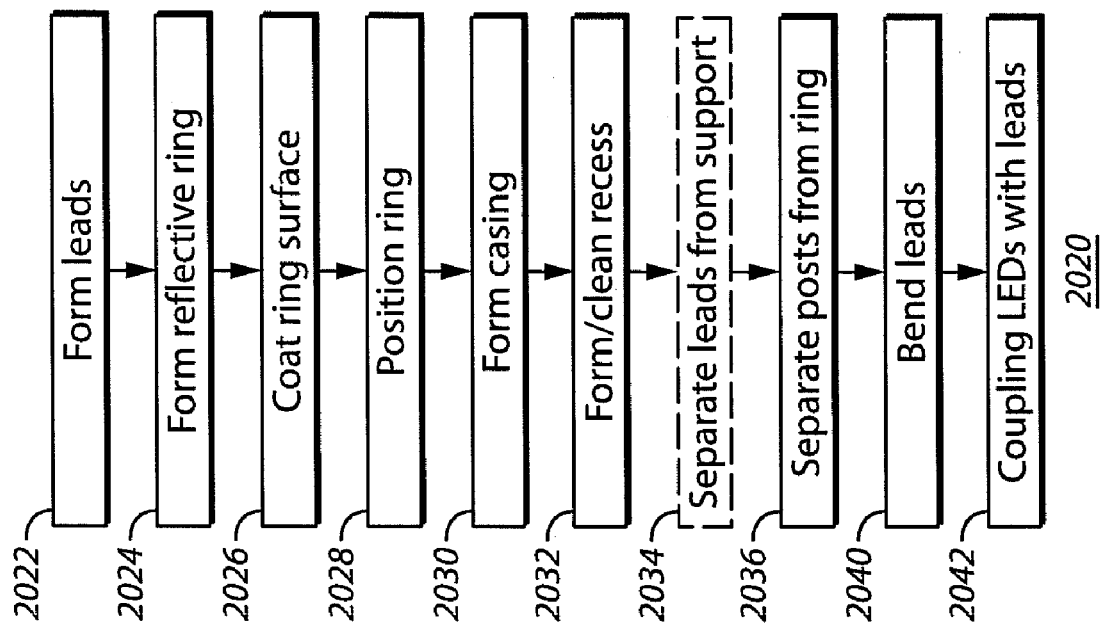

APPARATUS, SYSTEM AND METHOD FOR USE IN MOUNTING ELECTRONIC ELEMENTS

FIELD OF THE INVENTION

The present invention relates generally to mounted electronic elements and/or devices, and more particularly to surface mount device.

BACKGROUND

Over the last several decades there has been a dramatic increase in the number and types of devices that are implemented utilizing circuit boards. The frequency with which devices and/or chips are mounted onto circuit boards has similarly grown. Improving the mounting of devices improves the final product incorporating the mounted devices and can significantly reduce the cost and complexity of the product.

The mounting of devices can be achieved through soldering, bonding and other similar methods. Further, devices can be mounted in many different configurations and/or orientations. Some devices are configured to allow one or more orientations for mounting. It can be difficult to mount some of these devices, and further the mounting of some of these devices may deteriorate over time. As a result, the accuracy of the operation of the product incorporating these mounted devices can degrade and/or fail to operate.

SUMMARY OF THE EMBODIMENTS

The present embodiments advantageously address the needs above as well as other needs through the provision of apparatuses, systems and methods of manufacturing surface mountable devices. Some embodiments provide surface mount devices that comprise a casing comprising a recess formed in the casing and extending into the casing; an insert secured with the casing and extending about the recess defining a portion of a surface of the recess, the insert comprising a reflective surface exposed along the recess; and a plurality of leads partially exposed through the recess.

Further embodiments provide surface mount devices that include a casing comprising a first surface and a recess formed in the casing extend from the first surface and into the casing; a first plurality of leads extending from the recess through the casing and exiting the casing; an electronic device coupled with at least one of the plurality of leads and at least partially exposed through the recess; and an insert comprising a reflective surface, the insert extends about at least a portion of a surface of the recess and is secured with the casing with the reflective surface of the insert exposed through the recess.

Still further embodiments provide methods for use in manufacturing a surface mount device. Some of these methods include positioning a plurality of leads; positioning a ring with a reflective surface proximate the plurality of leads; securing the plurality of leads and the ring with a casing such that the ring is maintained at a predefined position relative to the leads with a reflective surface of the ring exposed through a recess of the casing; and securing an electronic device with at least one of the plurality of leads.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein:

FIGS. 2-4 show simplified plane views of the SMD of FIG. 1;

FIG. 20 depicts a flow diagram of a process for use in manufacturing an SMD according to some embodiments.

Figure 1:
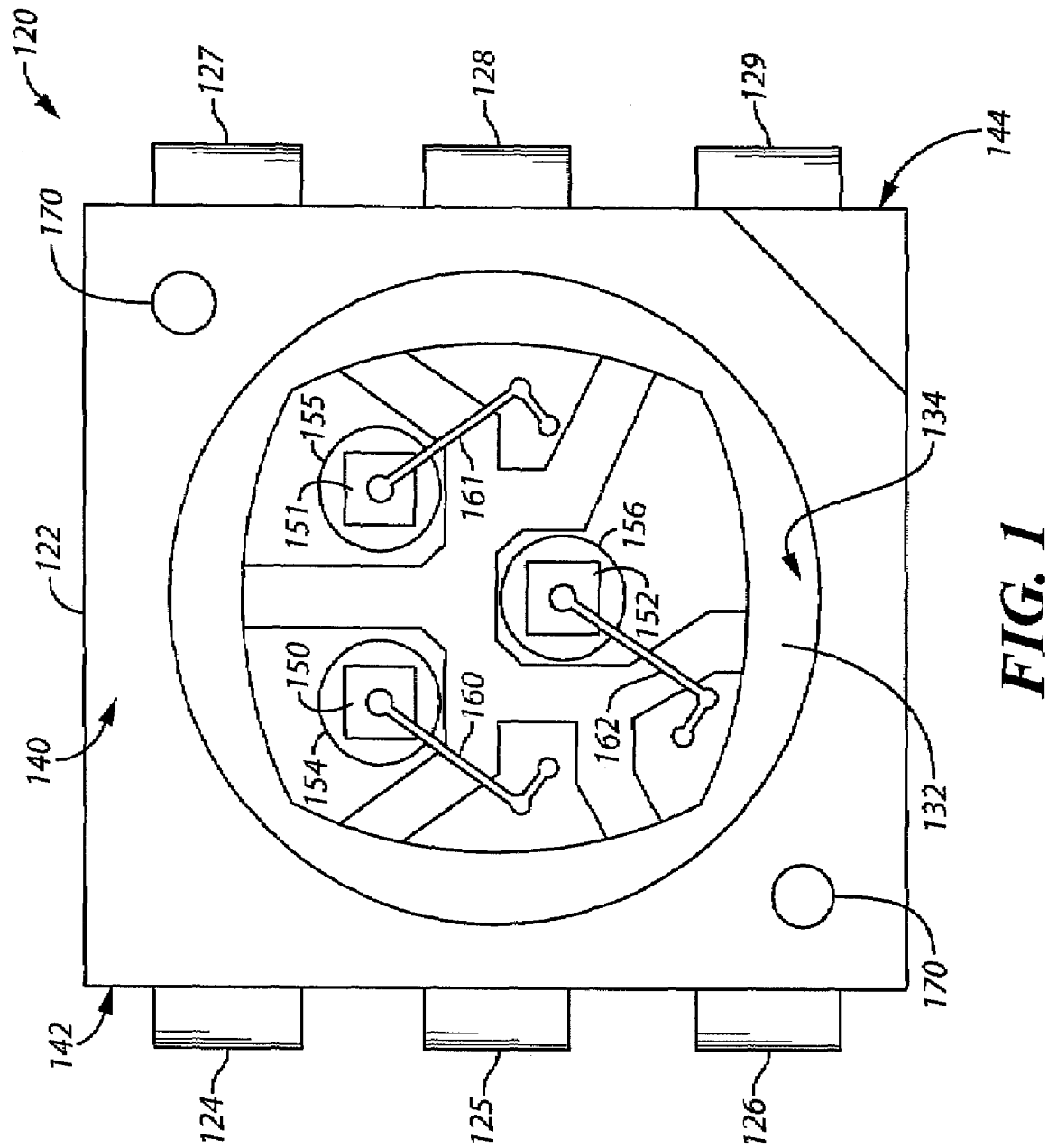
FIG. 1 depicts a simplified overhead, plane view of a surface mount device (SMD) according to some embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment often may not be depicted in order to facilitate a less obstructed view of these various embodiments of the present invention.

DETAILED DESCRIPTION

The present embodiments provide apparatuses, systems, methods of manufacturing and methods for mounting electronic elements and/or devices, such as mounting an electronic device onto a circuit board. Some embodiments are particularly applicable to surface mount device (SMD) packages used to mount electronic devices, such as optoelectronic elements that receive, emit, scatter and/or deflect light. The optoelectronic elements can include, for example, one or more light emitting diodes (LED), solar cells, photodiodes, laser diodes, and other such optoelectronic elements or combinations of optoelectronic elements. In some applications, the SMDs are utilized in image generation, such as in displays for use in displaying video images.

FIG. 1 depicts a simplified overhead, plane view of a surface mount device (SMD) 120 according to some embodiments that can be used to mount an electronic device, such as one or more LEDs, other optoelectronic element, and/or other devices. The SMD 120 includes a casing or housing 122 and a plurality of leads 124-129. The casing 122 further includes a recess or cavity 132 extending from a first surface 140 of the casing. In some embodiments, a reflective insert or ring 134 is positioned and secured along at least a portion of a perimeter or side of the recess 132.

The leads 124-129 are partially encased by the casing 122, and extend through one of a second and third surface 142, 144 of the casing 122. In the embodiment shown in FIG. 1, the SMD 120 is a six (6) pin SMD with six leads 124-129, and three leads extending through each of the first and second surfaces 142, 144. Further, three electronic devices 150-152, such as a red LED, green LED and blue LED, are each mounted and electrically coupled with a different one of the six leads, e.g., leads 124, 127 and 129. The LEDs or other electronic devices can be coupled with the chipset areas through an adhesive, coating, film, encapsulant, solder, paste, grease and/or other such relevant methods or combinations of methods. For example, the LEDs can be electrically coupled and secured with the leads 124, 127 and 129 through solder bumps 154-156.

FIGS. 2-4 show simplified plane views of the SMD 120 of FIG. 1, and for distinction are referred to as a front plane view of FIG. 2, a side plane view of FIG. 3, and a bottom plane view of FIG. 4. Further depicted in FIGS. 2-4 are a designated width 222, a designated height 320, and a designated length 420. As described above, the leads 124-129 extend through the casing to protrude or exit the casing from the second and third surfaces 142, 144, and in some implementations are bent along the second and third surfaces and can further be bent along a fourth surface 220, referred to for distinction as the bottom (see FIGS. 2 and 4). The dimensions of the leads 124-129 exterior to the casing 122 can depend on the intended implementation of the SMD 120, the LEDs or other electronic devices to be utilized, the material of the casing 122, the size of the SMD 120 and/or other such factors and/or combinations of factors. In some implementations for example, the widths 422 of the leads exterior to the casing can be between about 0.50 and 0.70 mm (e.g., 0.60 mm+/−0.05 mm), with a thickness 224 of about between about 0.15 and 0.40 mm (e.g., 0.25 mm+/−0.01 mm), and can be separated by a distance 424 between leads of between about 0.40 and 0.80 mm (e.g., 0.55 mm+/−0.05 mm), such as when the width 222 of the SMD is approximately 3.30 mm+/−0.05 mm and the length 420 is approximately 3.50 mm+/−0.05 mm.

Figure 5:
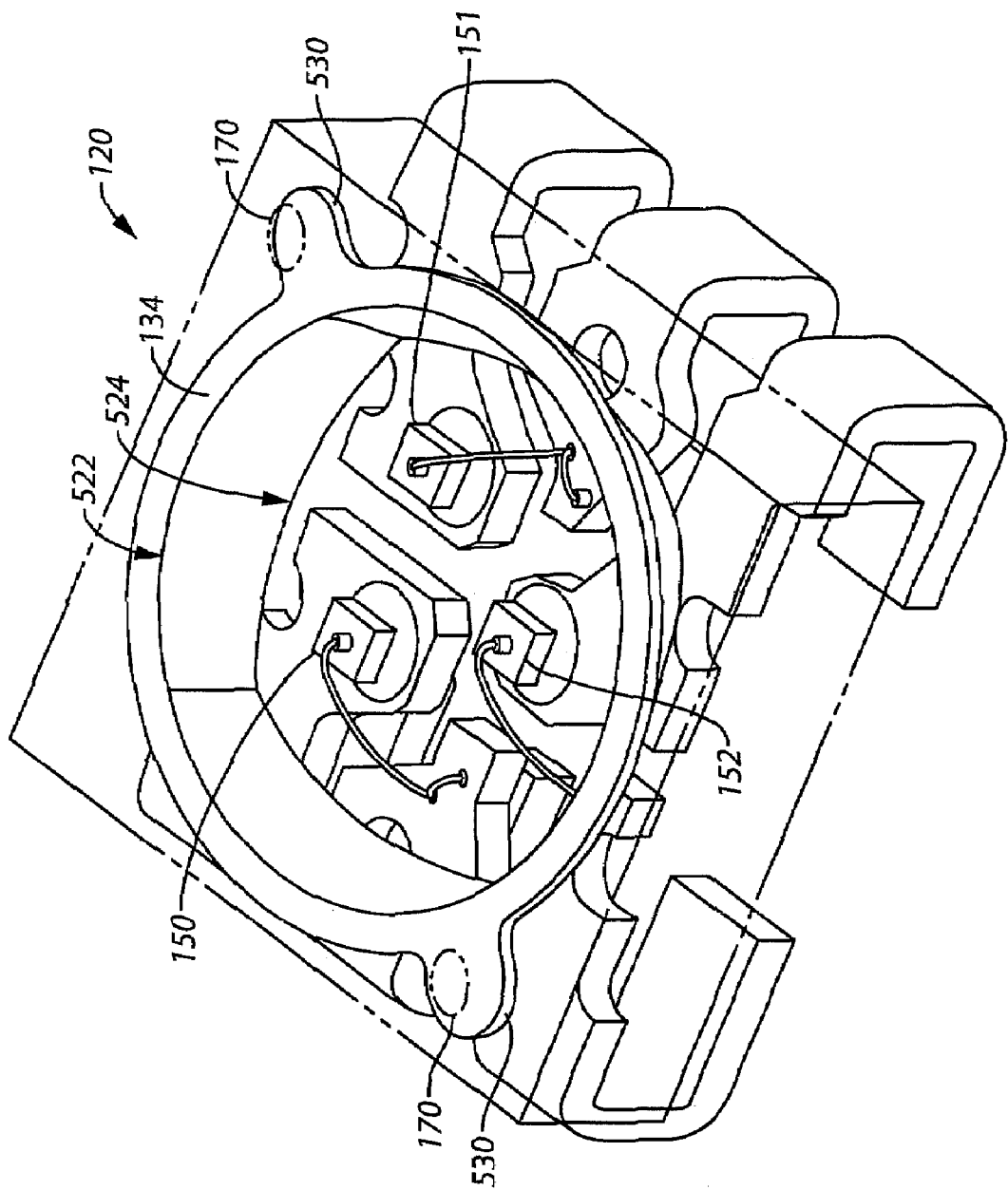
FIG. 5 depicts a simplified, partially transparent perspective view of the SMD of FIGS. 1-4.

FIG. 5 depicts a simplified, partially transparent perspective view of the SMD 120 of FIGS. 1-4. The reflective ring 134, according to some embodiments, is more clearly shown as extending along the perimeter of the recess 132 and positioned about the LEDs 150-152. The ring 134 includes a first edge 522, a second edge 524, and one or more tabs or extensions 530.

Figure 7:
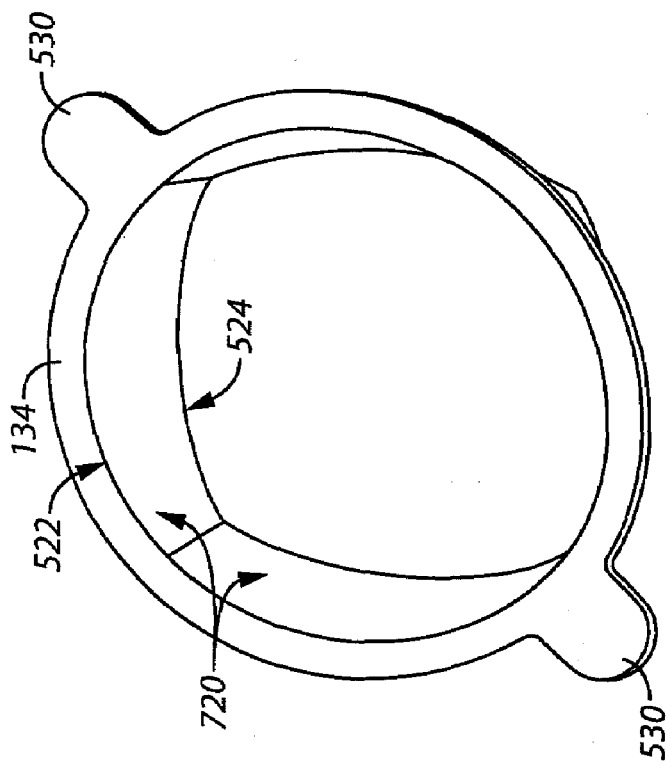
FIGS. 6 and 7 depict plane and perspective views, respectively, of a reflective ring incorporated with the SMD of FIG. 1.
Figure 6:
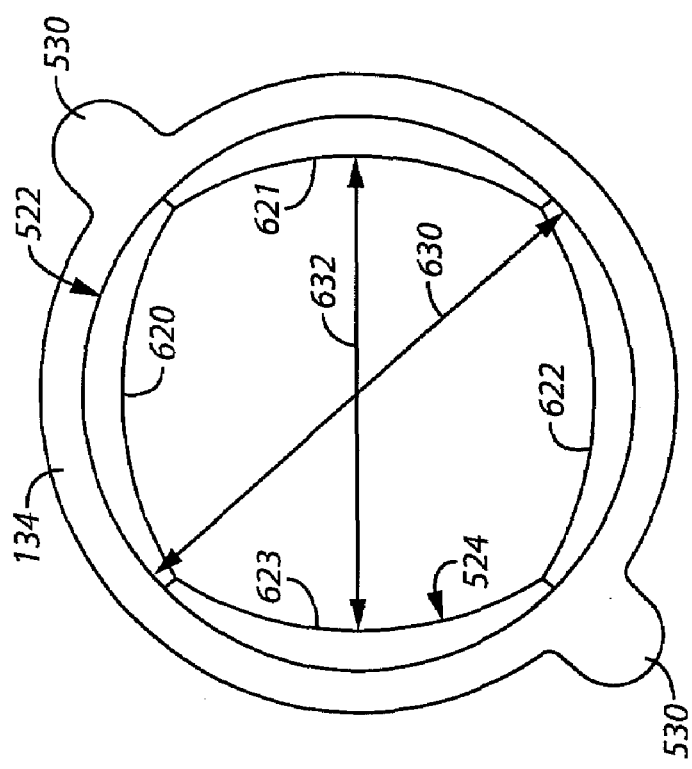

FIGS. 6 and 7 depict plane and perspective views of the ring 134, respectively, according to some embodiments. Referring to FIGS. 5-7, the ring 134 has a generally frusto-conical shape tapering from a first edge 522 to a second edge 524 with the first edge positioned when incorporated into the SMD 120 proximate the first surface 140 of the casing 122 and the second edge 524 positioned proximate the base of the recess 132 and the portions of the leads 124-129 exposed through the recess. In some implementations, at least an exterior and exposed surface 720 of the ring exposed through the recess 132 has a generally circular shape proximate the first edge 522, and tapers to the second edge 524. In some embodiments, the ring tapers from the first edge and is defined by four adjoining and/or adjacent sections or segments 620-623 establishing generally a more rectangular shape proximate the second edge 524 than the generally more circular shape at the first edge 522. The four sections at about the first and second edges 522, 524, in some embodiments, are formed as segments of four intersecting circles each having a radius 822 proximate the second edge that is greater than a radius 824 proximate the first edge 522 such that each section intersects two neighboring sections. The ring tapers from the first edge with the generally circular shape to the second edge.

Further, the distance or diameter 632 between opposite sections at the second edge 524, for example between sections 621 and 623, is less than the distance or diameter 630 of the ring at the first edge such that the ring tapers from the first edge 522 to the second edge 524. Incorporating the sections 620-623 into the ring can, in some instances, provide in part an increase in stability of the ring and improve the robustness of the SMD 120, while further achieving a desired reflection and dispersion of light. In some embodiments, the ring tapers from the generally circular shape at the first edge to the second edge that can have other relevant shapes, such as generally circular, generally rectangular, generally triangular or other relevant shapes.

The ring 134 can further include, in some implementations, one or more tabs 530 extending from an outer perimeter of the first edge 522. The tabs 530 can provide points of contact to hold the ring in a desired position during manufacturing of the SMD 120 as further described below. Additionally in some embodiments, when a ring 134 with tabs 530 is positioned within the SMD 120 the tabs 530 extend into and are encased by the casing, which can increase the stability of the ring 134 and aid in maintaining the positioning of the ring.

Referring to FIGS. 1 and 5, the casing in some embodiments further includes apertures or bores 150 extending into the casing. These bores 150 align with the tabs 530. In some embodiments, the tabs are held by supports or structures in a desired position relative to the leads 124-129 while the casing 122 is formed (e.g., through injection molding or otherwise secured with the leads 124-129 and ring 134) about the ring 134 forming the bores 150 in the casing 122 around the structure holding the tabs 530. The bores may, in some instances, be filled after molding, or the structure holding the tabs 530 may be cut, for example, to be level with or below the first surface 140 of the casing as further described below. The tabs 530 extend into the casing, and in part, can further aid in securing the ring 134 within the casing and/or maintaining positioning of the ring relative to the casing 122, leads 124-129 and/or LEDs 150-152.

Figure 9:
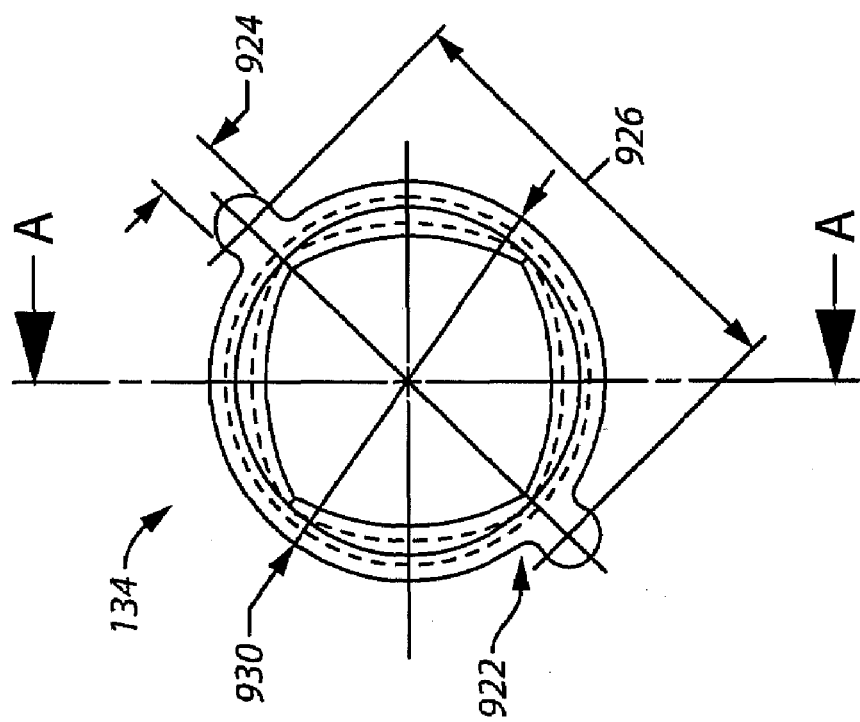
FIGS. 8-9 depict simplified overhead views of the reflective ring of FIG. 1.
Figure 8:
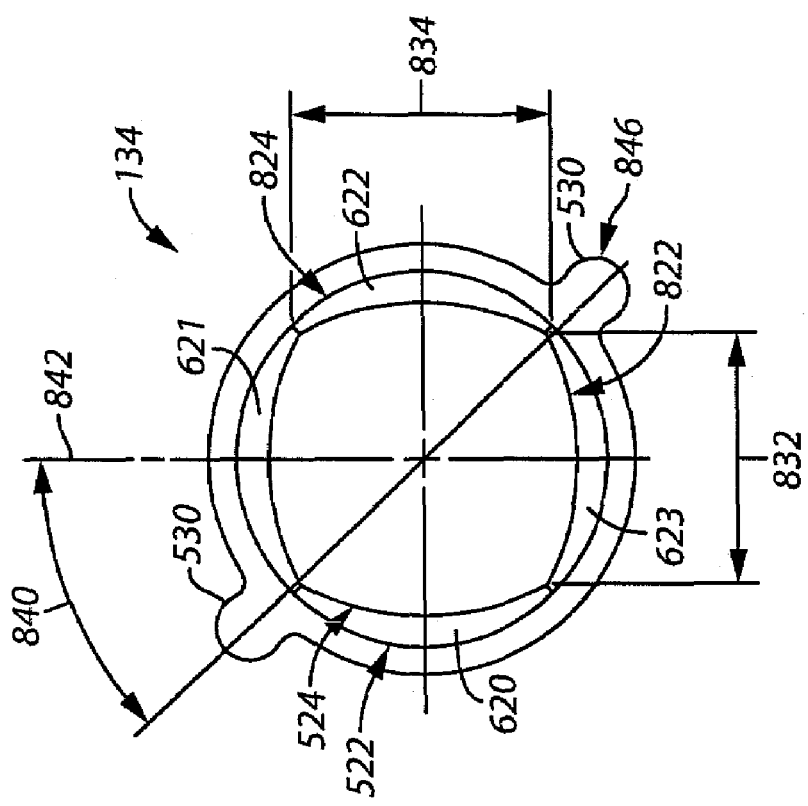

FIGS. 8-9 depict simplified overhead views of the reflective ring 134 according to some embodiments. The diameters 630 and 632 of the ring 134 at about the first edge 522 and the second edge 524, respectively, can depend on many factors as introduced above and further described below, and in some embodiments, additionally or alternatively depend on the dimensions of the recess 132 and/or the slope of tapering. For example in some implementations the SMD 120 may have a width 222 of approximately 3.30 mm, a length 420 of about 3.50 mm and a height 320 of about 2.00 mm, and the four segments 620-623 of the ring 134 can be constructed with radii 822 at about the second edge 524 of between approximately 1.75 and 2.00 mm (e.g., 1.87 mm +/−0.05 mm). The segments 620-623 extend to the first edge 522 and in some instances taper to radii 824 at about the first edge 522 of between approximately 1.35 and 1.55 mm (e.g., 1.46 mm+/−0.05 mm). Additionally the segments 620-623 can have lengths 832 along the second edge 524 of between about 1.70 and 1.90 mm (e.g., 1.80 mm+/−0.05 mm) and lengths 834 along the first edge 522 of between about 1.90 and 2.00 mm (e.g., 1.94 mm+/−0.05 mm).

Further in this example, the ring 134 can include the one or more tabs 530 extending away from a center of the ring. In some implementations, two tabs 530 extend from the first edge 522 proximate opposite segment intersections. For example, the tabs 530 can be positioned at an angle 840 of between about 35 to 50 degrees from an axis 842 extending through mid-points of opposite segments (e.g., second and fourth segments 621 and 623, respectively), and in some embodiments can be about 43 degrees+/−3 degrees from the axis 842. The tabs 530 can extend from the edge of the ring (e.g., with radii 922 of about 0.10 mm+/−0.05 mm), have widths 924 of about 0.50 mm+/−0.05 mm and can be curved along an exterior edge with radii 846 of about 0.25 mm+/−0.05 mm. The distance 926 between approximate centers of the tabs 530 can be between about 3.35 and 3.55 mm (e.g., 3.44 mm+/−0.05 mm).

Figure 10:
FIG. 10 depicts simplified side view of the ring of FIGS. 8-9.
Figure 12:
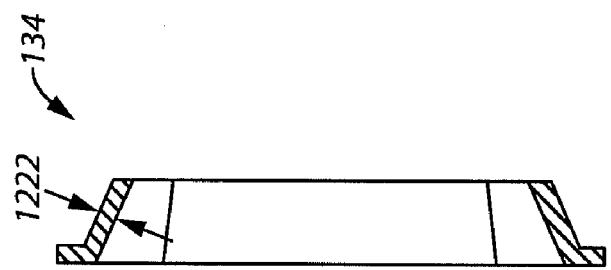
FIG. 12 depicts a simplified cross-sectional view of the ring of FIGS. 8-9 according to some implementations.
Figure 11:
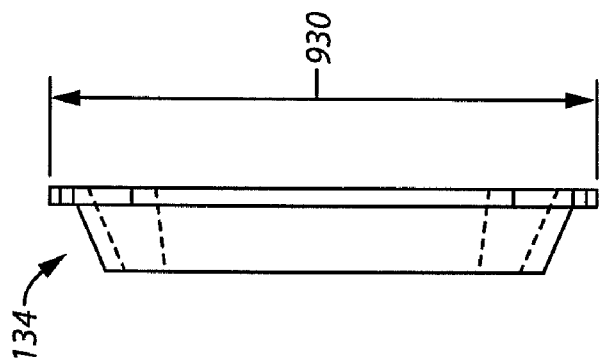
FIG. 11 depicts a simplified perspective side view of the ring of FIGS. 8-9.

FIG. 10 depicts simplified side view of the ring 134, FIG. 11 depicts a simplified perspective side view of the ring, and FIG. 12 depicts a simplified cross-sectional view of the ring 134 along the axis A-A of FIG. 9 according to some implementations. The height 1022 and the width or diameter 930 of the ring 134 can depend on the size of the SMD and typically is proportional to a depth 1324 of the recess 132 (see FIG. 13). The ring can further include a lip or ledge 1030 that extends from the tapered wall of the ring. The ledge extends around at least a portion of the perimeter of the ring, and typically completely around the perimeter of the ring 134. The ledge 1030 extends laterally from the tapered wall of the ring and can provide additional stability to the ring when mounted in the casing 122. The dimensions of the ledge can depend on many factors as introduced above and further described below. In some implementations, the ledge has a thickness 1032 that is about equal to the thickness 1222 of the ring, and can be for example about 0.10 mm+/−0.05 mm.

Figure 13:
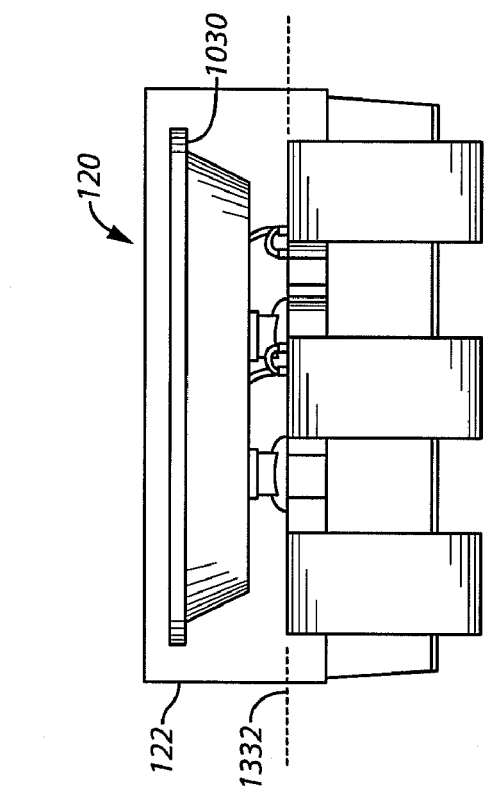
FIGS. 13-15 depict simplified, partially transparent views of the embodiment of the SMD of FIG. 1.
Figure 14:
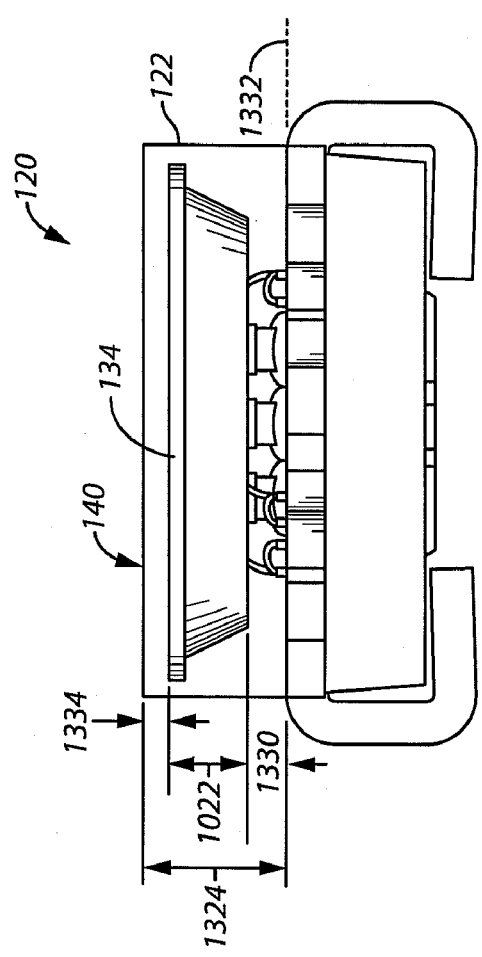
Figure 15:
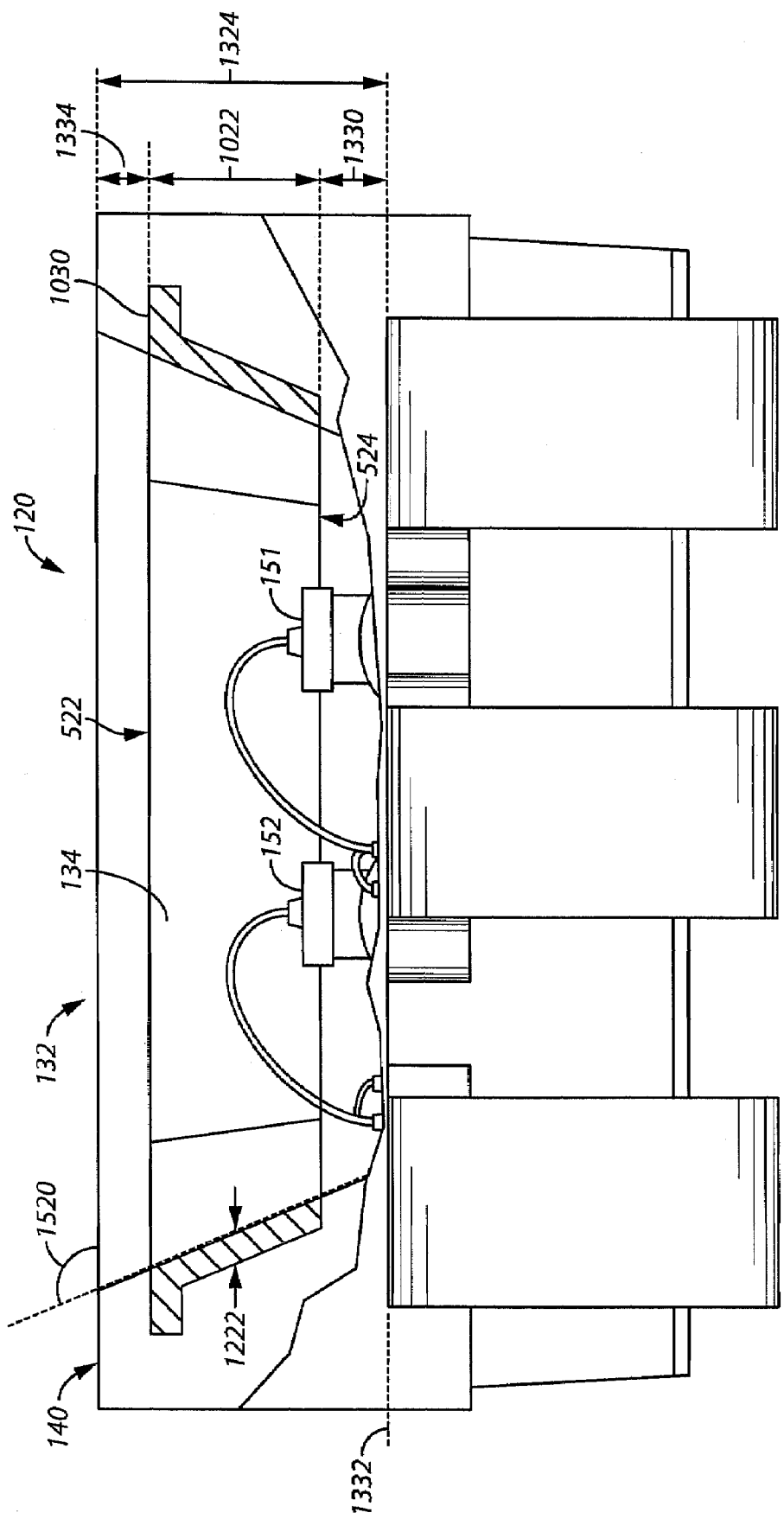

FIGS. 13-15 depict simplified, partially transparent views of the embodiment of the SMD 120 of FIG. 1. Specifically, FIG. 13 shows a partially transparent, front plane view of the SMD 120; FIG. 14 shows a partially transparent, side plane view of the SMD 120; and FIG. 15 shows a partially transparent, cut-away side plane view of the SMD 120. The partial cut-away view of FIG. 15 shows a cross-sectional view of the ring 134 positioned within the recess 132 and around the LEDs 151, 152. The frustoconical shape of at least the exposed surface 720 of the ring 134 is evident in FIGS. 13-15 tapering from the first edge 522 to the second edge 524. The ring is integral with the recess 132, and in some implementations the ring 134 is flush with the recess forming at least a portion of the surface of the recess. The angle of taper 1520 is implemented to achieve a desired reflection of light emitted from the LEDs 150-152, intended use of the SMD 120, reflection of light from exterior to the SMD to light detectors mounted on the leads in the recess, and/or other relevant effects. In some implementations the angle of tapering 1520 is between about 100 and 140 degrees, and in some embodiments between 110 and 130 degrees, for example, about 112 degrees.

In some embodiments, the ring 134 has a height 1022 that is less than the height 1324 of the casing above the exposed surfaces of the leads 124-129, which is typically the depth of the recess 132. The ring 134 can be positioned a first distance 1330 from a plane 1332 defined generally by the exposed surfaces of the leads, and is a second distance 1334 from the exterior first surface 140 of the casing 122. The casing material above and below the ring 134 can provide additional support for the ring 132 and can aid in maintaining the positioning of the ring to provide a stable and durable SMD package. The ring 134 further includes, in some implementations, the ledge 1030 that extends from the tapered wall of the ring and can provide further support for the ring and is encased by the casing 122. As such, the ledge additionally provides further stability, structural support and enhances the overall integrity of the ring 134 and SMD 120.

The dimensions of the ring can depend on the intended implementation of the SMD, the material of the casing 122, the size of the SMD 120, the size of the ledge 1030 and/or tabs 530, the size of the LEDs and/or other such relevant factors. In some embodiments, the height 1022 of the ring 134 can be proportional to the depth 1324 of the recess 132, and in some instances the ratio of the height 1022 of the ring to the depth 1324 of the recess can be about 3-to-5. In some embodiments, the height 1022 of the ring is approximately between 50 to 70 percent the depth 1324 of the recess, and in some implementations is about between 55 to 65 percent the depth of the recess. For example, with an SMD having a height 320 of approximately 2.00 mm with a recess 132 having a depth of about 0.85 mm, the ring 134 can be constructed with a height of about 0.50 mm. Further in this example, the ring can be positioned within the recess such that the distance 1334 from the first edge 522 of the ring to the first surface 140 of the casing 122 is approximately 0.15 mm, and the distance 1330 between the second edge 524 of the ring and the plane 1332 defined by the exposed surfaces of the leads 124-129, and typically defining the base of the recess 132, is about 0.20 mm and/or is proportional to the height of the LEDs 150-152 or other electronic devices incorporated into the SMD package 120.

The diameters 630 and 632 of the ring 134 at about the first edge 522 and the second edge, respectively, can similarly depend on many factors as introduced above, and in some embodiments, additionally or alternatively depend on the dimensions of the recess and the slope of tapering. For example in some implementations, the SMD 120 may have a width 222 of approximately 3.30 mm+/−0.05 mm, a length 420 of about 3.50 mm+/−0.05 mm and a height 320 of about 2.00 mm+/−0.05 mm, with the ring having a diameter 634 across the ledge 1030 of about 3.08 mm+/−0.05 mm, and the segments 620-623 having radii 824 at about the first edge 522 of approximately 1.46 mm+/−0.05 mm and radii 822 at about the second edge 524 of approximately 1.87 mm+/−0.05 mm.

The ring 134 or at least the exposed surface 720 of the ring is configured to reflect light emitted from the LED(s) and/or light received through the recess 132 to be directed to light detectors coupled to the leads 124-129, depending on an implementation and/or configuration of the SMD 120. The ring 134 can be constructed of a reflective material, such as a reflective metal. Additionally or alternatively, the ring can be constructed of metal, plastic, ceramic or other relevant material and/or combinations of materials with the exposed surface 720 coated with a reflective material, such as, silver or other relevant material with desired reflective properties. For example, the ring 134 can be constructed of a metal similar to or the same as the material of the leads 124-129 and coated with a reflective metal. In some implementations, the ring is constructed of copper and/or copper alloy with silver coating defining at least the exposed surface 720. The thickness 1222 of the ring 134 can depend on the intended implementation of the SMD, the LEDs employed in the SMD and other relevant factors. In some embodiments, the thickness 1222 can be proportional to the height 1022 of the ring. For example, a ring 134 having a height of about 0.50 mm, the thickness can be about 0.10 mm.

Referring back to FIG. 1, the ring 134 is positioned about the LEDs 150-152 such that light emitted from the LEDs is reflected by the exposed and reflective surface 720 of the ring. Due at least in part to the reflectivity of the ring, the casing can be constructed of substantially any relevant material. Further in some implementations, the casing can be constructed of substantially any relevant material without regard for the materials reflective capabilities because the ring 134 provides desired light reflection. For example, the casing can be formed of one or more resins, epoxies, thermoplastic polycondensates (e.g., a polyphthalamide (PPA)), plastics, glass, nylon and/or other such relevant materials and/or combinations of materials. In some embodiments, the casing is formed of a black PPA material. It has been found that black PPA material is beneficial in use with image generation SMD packages, such as with SMDs employed in video displays and/or other image generation devices. Often SMD packages are constructed of white PPA material. The use of black PPA material, however, with image generation and/or video displays typically provides improved image quality over white PPA material. Black PPA material, however, can reduce the overall brightness emitted from an SMD package. The ring 134 enhances the light emission from the SMD package 120. As such, the casing 122 can be formed, for example, of a black PPA material with the ring 134 embedded within the recess 132 of the case achieving the improved quality while still achieving a desired brightness and/or light emission.

Many image generation SMDs and other SMD packages employ one or more LEDs that are mounted in the SMD and couple with the leads to receive power. In the embodiment of the SMD package 120 of FIG. 1, the SMD includes three LEDs (e.g., a red LED, a green LED and a blue LED). The SMD, however, can be implemented with fewer or more LEDs or other electronic devices. Further, the SMD includes the leads 124-129 to couple with the LEDs to at least in part supply power to the LEDs. Six leads 124-129 are provided in some embodiments with each LED coupling with two of the six leads.

In some embodiments, the one or more LEDs or other electronic devices 150-152 are each supported by and/or coupled with a first lead, for example, the first LED 150 is coupled with a first lead 124, the second LED 151 is coupled with a fourth lead 127 and the third LED 152 is coupled with a sixth lead 129. Further, each LED is coupled with a secondary lead, for example, the first LED further couples with a second lead 126, the second LED further couples with a fifth lead 128 and the third LED further couples with a third lead 126. The coupling to the secondary leads, for example, can be implemented through connections 160-162 (e.g., a bond wire, jump wire or other such connection). In some embodiments, the connections 160-162 further include an additional coupling or a secondary jump to the second, third, and fifth leads 125, 126 and 128.

Figure 17:
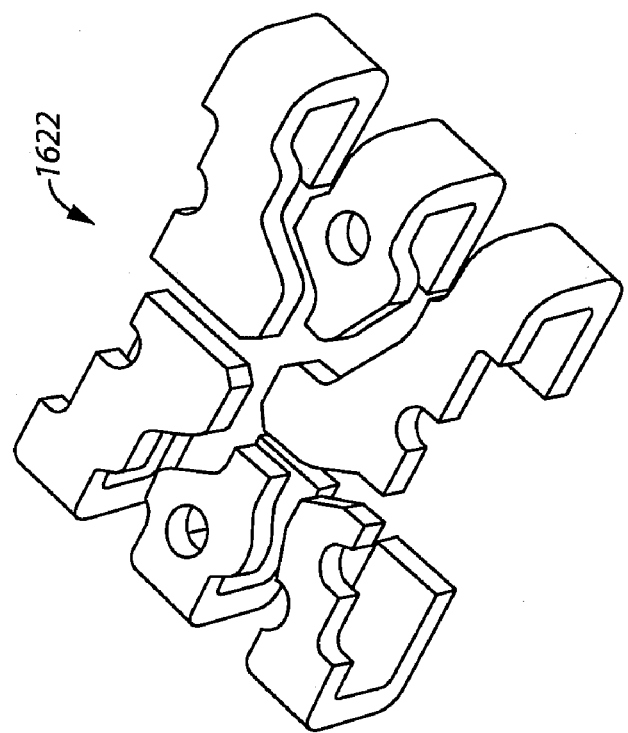
FIGS. 16-18 depict simplified overhead perspective and plane views of a lead configuration that can be employed in the SMD of FIG. 1.
Figure 16:
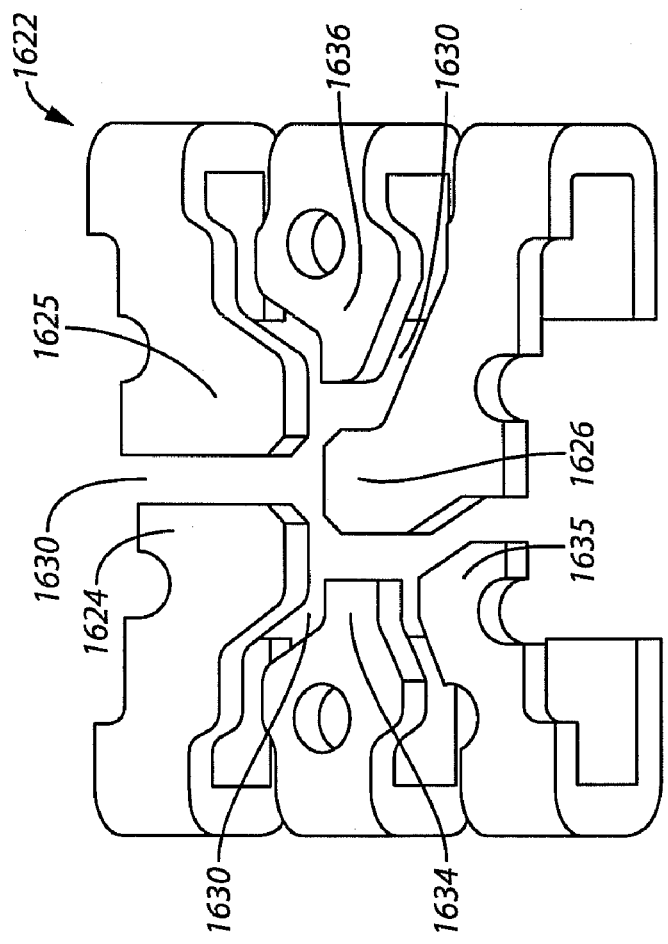
Figure 19:
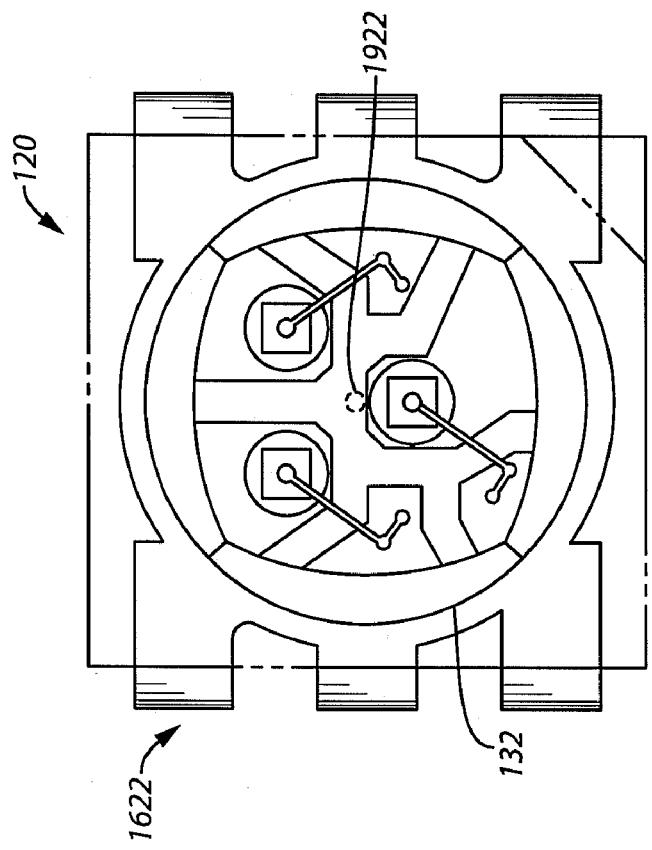
FIG. 19 depicts a simplified partially transparent overhead plane view of the SMD of FIG. 1 showing the lead configuration of FIGS. 16-18.
Figure 18:
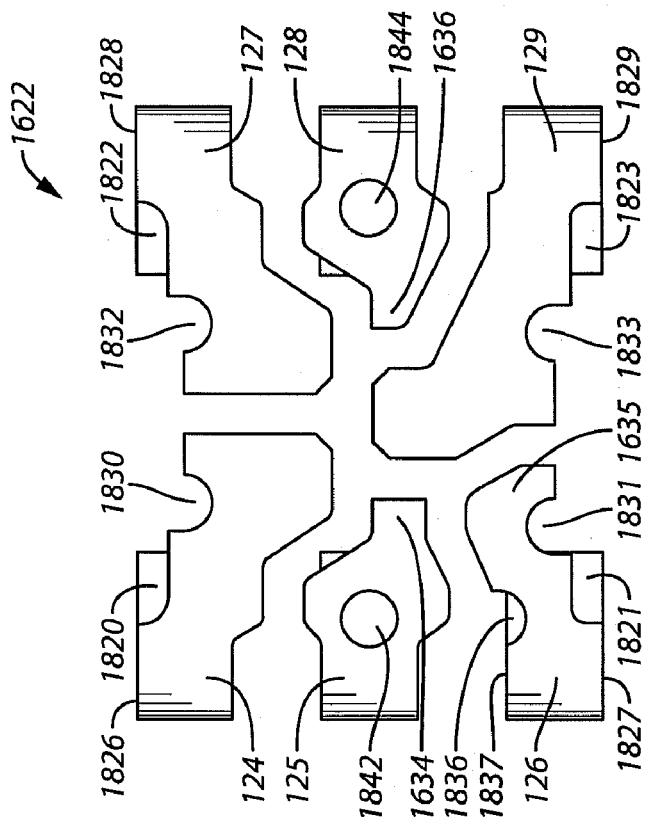

FIGS. 16-18 depict simplified overhead perspective and plane views of a lead configuration 1622 that can be employed in the SMD 120 of FIG. 1 according to some embodiments. FIG. 19 depicts a simplified partially transparent overhead plane view of the SMD 120 of FIG. 1 showing the lead configuration 1622 of FIGS. 16-18. Referring to FIGS. 1 and 16-19, the lead configuration 1622 includes six leads 124-129, with electronic devices, such as LEDs 150-152, coupling to the leads. A portion of each lead is exposed through the recess 132 and extends generally from the recess into the casing 122, through the casing, and exiting the casing with three leads exit the casing through each of the second and third sides 142, 144.

The leads 124-129 are typically made from electrically conductive material, such as copper, copper alloy, and/or other such relevant materials or combinations of materials. In some implementations, the lead material is also thermally conductive to assist, at least in part, in drawing heat away from the LEDs or other electronic devices incorporated into the SMD 120.

Three of the leads (e.g., first, fourth and sixth leads 124, 127 and 129) are configured to extend further toward a center (labeled generally as 1922 on FIG. 19) of the recess and include chipset areas 1624-1626. The LEDs or other electronic devices 150-152 are mounted on and supported by the chipset areas of the first, fourth and sixth leads 124, 127 and 129. In some implementations, the first, fourth and sixth leads are coupled with cathode portions of the LEDs, and can be defined as the cathode leads of the SMD package 120. Further, the second, third and fifth leads can couple with anode portions of the LEDs and can be defined as the anode leads of the SMD package 120. Each of the leads is electrically separated and/or insulated by one or more insulation gaps 1630 from other leads. The insulation gaps 1630 can be substantially any size that at least electrically isolates the leads from the other leads. In some embodiments, the insulation gaps are typically greater than 0.10 mm, in some instances greater than 0.20, for example 0.25 mm.

The chipset areas 1624-1626 can be configured, in part, to support and electrically couple with the LEDs 150-152. The LEDs can be electrically coupled with the chipset areas through an adhesive, coating, film, encapsulant, solder, paste, grease and/or other such relevant methods or combinations of methods. For example, the LEDs can be electrically coupled and secured with the chipset areas 1624-1626 through solder bumps 154-156 (see for example, FIG. 1). In some implementations, the coupling can additionally provide thermal coupling to enhance the dissipation of heat from the LEDs or other electronic devices incorporated with the SMD 120.

Further, each LED 150-152 or other electronic device is coupled with a secondary lead 125, 126, 128. For example, in some embodiments the LEDs are electrically coupled to head or coupling portions 1634-1636 of the secondary leads through wire connections 160-162. Alternatively, the LEDs may be partially supported by and coupled with a first lead and extend over the insulation gap between the leads to couple with the head portions of the secondary leads.

In some embodiments, one or more of the leads 124-129 further include one or more indentations, through holes or apertures, extensions, tapering and/or other features that in part improve the stability, integrity and/or robustness of the SMD package 120. For example, the first, third, fourth and sixth leads 124, 126, 127 and 129 include indentations 1820-1823 that extend generally in toward a center of the SMD 120 along and defining outside edges 1826-1829 of the first, third, fourth and sixth leads, respectively. Additional indentations 1830-1833 can also be included extending further toward a center 1922, and in some implementations the additional indentations are generally semicircular. The size of the elongated indentations 1820-1823 and additional semicircular indentations 1830-1833 can depend on the intended implementation of the SMD, the LEDs or other electronic devices to be utilized, and/or other such factors. For example in some implementations, the elongated indentation can initially indented approximately 0.20 mm in the lead when the widths 422 of the leads as they exit the casing are about 0.60 mm, and the additional semicircular indentations can have radii of approximately 0.175 mm. The outside edges 1826-1829 of the first, third, fourth and sixth leads follow along the elongated indentations 1820-1823 and the additional indentations 1830-1833. Further, the outside edges may not extend to align with the portion of the edge on the opposite side of the additional semicircular indentations. For example, the portion of the outside edge on a side of the semicircular indentation closer to the second and third sides 142, 144 of the casing may indent 0.20 mm, and the outside edge opposite the semicircular indentation may indent 0.30 mm.

The first and fourth leads 124 and 127 can further taper toward the center 1922 of the recess 132 and/or SMD. In some implementations, the tapering is implemented through graduated transitions or steps with an enlarged graduation or step in part defining the chipset areas 1624 and 1625, respectively. The sixth lead 129 similarly tapers toward a center such that the chipset area 1626 is proximate the chipset areas 1624, 1625 of the first and fourth leads. Again, the tapering of the sixth lead can be implemented through a series of steps or graduations, and in some embodiments extends further into the recess than the chipset areas 1624-1625 of the first and fourth leads 124, 127.

The third lead 126 can include an indentation 1836 along an interior edge 1837 generally opposite the elongated indentation 1821. The indentation 1836 can also, in some implementations, be generally semicircular with a radius of about 0.175 mm. The third lead 126 can further taper generally toward a center of the recess defining a coupling area 1635 to which a jump wire 162 or other coupling can be connected.

The second and fourth leads 125 and 128, respectively, bulge or expand and then narrow as the leads extend toward a center 1922 of the recess defining coupling areas 1634, 1636. An aperture or through hole 1842, 1844 can further be included in the second and fourth leads, respectively. The apertures 1842 and 1844 can be positioned proximate the bulged portion, and in some implementations have diameters of approximately 0.30 mm, for example, when the widths 422 of the leads as they exit the casing are about 0.60 mm.

In some embodiments, the recess 132 is at least partially filled with a fill material. The fill material can provide protection to the exposed leads 124-129 and/or the LEDs 150-152. In some instances, the fill material covers the LEDs, the portions of the leads 124-129 exposed through the recess, and the electrical connections 160-162. The fill material can also, at least partially, fill the insulation gaps 1630, the indentations and/or the areas of the casing exposed by the indentations, tapering and contouring of the leads 124-129 such that the fill material extends into these vacant areas. The fill material can provide protection for the LEDs and electrical connections. Additionally, the fill material can, in part, enhance the distribution and/or detection of light for the electronic devices. The fill material can be formed from one or more of a resin, an epoxy, a thermoplastic polycondensate, plastics, glass, nylon and/or other such relevant materials and/or combinations of materials. In some embodiments, additional materials are added to the fill material to enhance the emission, absorption and/or dispersion of light to and/or from the electronic devices incorporated within the recess 132.

The indentations, apertures, extensions, contouring, tapering and other features of the leads 124-129 cooperate with the casing and/or fill material, at least in part, to enhance the structural stability and integrity of the SMD package 120. In some implementations, the casing material, fill material and/or other material (e.g., epoxy, resin, adhesive, and other such relevant material) extend at least partially around, into and/or through one or more of the insulation gaps 1630, and areas exposed by the indentations, apertures and tapering of the lead configurations. For example, those areas encased by the casing 122 can be at least partially filled with casing material, one or more pegs extending through the indentations or other vacant areas and other such configurations. Further, the indentations, apertures, extensions, contouring, tapering and other features of the leads 124-129, in part, provide surface bonding areas around the leads 124-129 including the casing beneath the leads exposed by the insulation gaps, indentations, apertures, tapering and other vacant areas to bond with the fill material and/or casing material above the leads and/or extending through the gaps, indentations, apertures and vacant areas.

The enhanced bonding provided through and around the leads, at least in part, enhances the stability of the leads relative to the casing and the structural integrity of the SMD 120. Further, the bonding or adhesion between casing material and/or between casing material and fill material is typically greater than the bonding or adhesion established between the casing and the leads, and between the leads and the fill material. This increased adhesion between the casing, and between the fill material and the casing further contributes to maintaining the configuration, structural integrity and/or robustness of the SMD 120. Furthermore, by incorporating casing material and/or fill material into vacant areas the relative positioning of the chipset areas 1624-1626 and/or LEDs 150-152 or other electronic devices are more precisely maintained. The increased stability of the LEDs further improves performance and increases reliability of the SMD 120.

The casing 122 can be formed and/or assembled through one or more methods. In some embodiments, the casing is formed or molded around the leads 124-129. Additionally or alternatively, the casing can be molded into sections, for example, top and bottom sections. Each section may incorporate molding that facilitates, in part, securing the leads with the sections of the casings. For example, the top and bottom portions can be secured together sandwiching portions of the leads, such as, with adhesive material, peg and slots, snap fit, friction fit, and/or other relevant methods or combinations of methods. In other embodiments, a base section may be pre-molded allocating space for the leads to be secured onto the base of the casing, and a top section of the casing is formed, molded or poured over the leads and base section of the casing.

For example, the top portion of the casing can be formed by injection molding or pouring casing material on the bottom portion encasing portions of the leads 124-129. Some or portions of the vacant areas defined by the indentations 1820-1823, 1830-1833, 1836, insulation gaps 1630, tapering and other contouring of the leads are covered by and at least partially filled with casing material while forming the top portions. In other embodiments, the bottom of the casing 122 is molded such that casing material beneath the leads extends through one or more of the vacant areas, insulation gap, apertures and/or indentations to mate or cooperate with a top portion of the casing 122 above the leads. In some implementations, the casing 122 can include one or more pegs that extend through the indentations, insulation gap, and/or apertures to couple with slots in the casing opposite the pegs. In some embodiments, adhesive material can be added to the insulation gaps, apertures and/or indentations to secure sections of the casing 122 together about the leads. Further in some embodiments of manufacturing, the fill material is a liquid or semi-liquid that is poured into the recess 132 of the casing 122. The fill material adheres to the casing 122 around the leads exposed through the insulation gaps 1630, apertures 1842, 1844, indentations 1820-1823, 1830-1833, 1836 and/or other vacant areas.

In some methods of manufacturing, the LEDs are coupled to the leads 124-129 prior to constructing and/or assembling the casing 122 about the leads. Alternatively, the LEDs or other electronic devices may be coupled to the leads after the leads are partially encased within the casing 122. The casing 122 may be configured with the recess 132 that extends into the casing such that a sufficient portion of at least the chipset areas 1624-1626 and coupling areas 1634-1636 are exposed to receive, mount and electrically couple the LEDs or other electronic devices within the recess 132.

FIG. 20 depicts a flow diagram of a process 2020 for use in manufacturing an SMD 120 according to some embodiments. In step 2022, the leads 124-129 are formed. The forming of the leads can be achieved through metal stamping, injection molding, cutting, etching, bending or through other methods and/or combinations of methods to achieve the desired lead configuration 1622 with vacant areas defined by indentations, apertures, tapering, insulation gaps and the like. For example, the leads can be partially metal stamped (e.g., stamped simultaneously from a single sheet of relevant material), appropriately bent, and finally fully separated or fully separated following the formation of some or all of the casing 122. In step 2024, the reflecting ring 134 is formed. Similarly, the ring can be formed through metal stamping, pressing, injection molding, cutting, etching, bending or through other methods and/or combinations of methods to achieve the desired ring. In step 2026, a reflective coating is applied to the ring surface, such as a layer of silver deposited onto the surface of the ring. In those instances where the ring is initially formed of a sufficiently reflective material, step 2026 can be skipped.

In step 2028, the leads are positioned and the ring is positioned in a desired position relative to the leads 124-129. In some embodiments, posts or other structures are secured with the tabs 530 of the ring and the ring is held in position relative to the leads using the posts or other structures. In step 2030, the casing 122 is formed and/or secured with the ring 134 and leads 124-129. In some embodiments, the casing is formed through an injection molding process molding the casing in the desired shape about the ring and leads. In other implementations, the casing can be shaped to fit with the ring and leads and then secured with the ring and leads through adhesive, friction fits, pegs and slots, and other relevant methods. In step 2032, the recess 132 is formed and/or the chipset portions 1624-1626 and/or ring 134 are cleared and exposed. In those implementations where the casing 122 is injection molded the recess may be formed while molding. The chipset portions and/or ring, however, may include some residual casing material and/or other stray material. This residual or stray material can be removed in step 2032. In other embodiments, the recess is cut, etched or otherwise formed through the first surface 140 of the casing 122 and along the ring 134.

In some embodiments, the process 2020 includes an optional step 2034 where the leads are separated from a support structure and/or sheet of metal. In some implementations where the leads are cut or stamped from a sheet of relevant material, the leads may not be fully separated to allow for simplified handling of the leads and/or to increase production by mass processing multiple SMDs at a time. In step 2036, the posts or other support structures supporting the ring and secured with the tabs 530 are released, for example, by cutting the posts substantially flush with or below the first surface 140 of the casing 122.

In step 2040, the portions of the leads 124-129 exiting the casing 122 are bent along the second and third surfaces 142, 144 of the casing and again along the fourth surface 220. In alternative embodiments, the leads exterior to the casing can be bent in other relevant configurations or not bent. In step 2042, one or more electronic devices, such as LEDs, are secured and/or electrically coupled with one or more of the leads such that the ring is positioned about and/or surrounding at least a portion of the one or more electronic devices. One or more of the steps of the process 2020 can be implemented in different orders, for example, the LEDs can be coupled with the leads prior to steps 2034, 2036 and 2040, or other such variations.

Variations to the process 2020 can be employed in some embodiments. For example, the process 2020 can include steps of forming a top portion of the casing with the ring 134 and a bottom portion of the casing. Step 2030 can instead provide for the top and bottom portions to be secured together about the leads 124-129, such as with pegs extending from the bottom portion through the one or more indentations and/or vacant areas of the leads to mate with bores or slots in the top portion. Other steps can additionally and/or alternatively be employed in manufacturing surface mount devices according to some embodiments.

While the invention herein disclosed has been described by means of specific embodiments and applications thereof, numerous modifications and variations could be made thereto by those skilled in the art without departing from the scope of the invention set forth in the claims.

What is claimed is:

1. A surface mount device comprising:
   a casing comprising a recess formed in the casing and extending into the casing;
   an insert secured with the casing and extending about the recess defining a portion of a surface of the recess, wherein the insert comprises a ring circumferentially extending about and defining the portion of the surface of the recess, wherein the insert further has a first edge positioned proximate a surface of the casing, and a second edge distal from the surface of the casing, where the insert comprises four adjacent sections and tapers from the first edge to the second edge, the insert further comprising a reflective surface exposed along the recess; and
   a plurality of leads partially exposed through the recess, at least one of said plurality of leads partially encased by and extending exterior to said casing.

2. The surface mount device of claim 1, wherein the ring has a height that is less than the height of the recess.

3. The surface mount device of claim 1, wherein the casing is at least partially constructed of black polyphthalamide material.

4. The surface mount device of claim 1, wherein each of the four sections are generally portions of circles each having a first radius proximate the second edge that is greater than a second radius proximate the first edge such that each section intersects two neighboring sections.

5. The surface mount device of claim 1, further comprising an electronic device coupled with a first lead of the first plurality of leads, wherein the recess exposes at least a portion of the electronic device.

6. A surface mount device comprising:
   a casing comprising a tapered recess formed in the casing and extending into the casing;
   an insert secured with the casing and extending about the recess defining a portion of a surface of the recess, wherein the insert comprises a ring circumferentially extending about and defining the portion of the surface of the recess, wherein the insert further comprises tabs that generally extend away from the reflective surface and into the casing, said tabs completely encased by said casing, the insert further comprising a reflective surface exposed along the recess; and
   a plurality of leads partially exposed through the recess, at least one of said plurality of leads partially encased by and extending exterior to said casing.

7. A surface mount device comprising:
a casing comprising a tapered recess formed in the casing and extending into the casing;
an insert secured with the casing and extending about the recess defining a portion of a surface of the recess, wherein the insert comprises a reflective surface exposed along the recess, the insert further comprising a first edge positioned proximate an exterior surface of the casing, a second edge distal from the exterior surface of the casing, and a ledge proximate the first edge that extends away from the reflective surface and into the casing, said ledge further comprising tabs extending from the ledge into the casing, said tabs completely encased by said casing; and
a plurality of leads partially exposed through the recess, at least one of said plurality of leads partially encased by and extending exterior to said casing.

8. A surface mount device comprising:
a casing comprising a first surface and a recess formed in the casing extending from the first surface and into the casing;
a first plurality of leads extending from the recess through the casing and exiting the casing;
an electronic device coupled with at least one of the plurality of leads and at least partially exposed through the recess; and
an insert comprising a reflective surface, the insert extending about at least a portion of a surface of the recess and secured with the casing with the reflective surface of the insert exposed through the recess, wherein the insert is a ring extending entirely around a perimeter of the recess, wherein the insert further comprises a first edge proximate the first surface of the casing and a second edge distal from the first surface of the casing wherein the second edge comprises a plurality of adjoining segments, wherein the plurality of segments comprise four curved segments with each of the four curved segments having a first radius proximate the second edge that is greater than a second radius proximate the first edge of the insert.

9. The surface mount device of claim 8, wherein the reflective surface of the insert is generally frustoconical shaped.

10. A surface mount device comprising:
a casing comprising a tapered recess formed in the casing and extending into the casing;
an inwardly tapering insert distinct from and secured to the casing, wherein the insert is generally ring-shaped and circumferentially extends about a portion of the surface of the recess such that the insert defines at least a portion of the surface of the recess, said insert further comprising tabs extending into said casing, said tabs completely encased by said casing.

11. The surface mount device of claim 10, wherein the insert has a height that is less than the height of the recess.

12. The surface mount device of claim 10, wherein the casing is at least partially constructed of a black material.

13. The surface mount device of claim 10, wherein the casing is at least partially constructed of black polyphthalamide material.

14. The surface mount device of claim 10, further comprising a plurality of leads partially exposed through the recess, at least one of said plurality of leads partially encased by and extending exterior to said casing.

15. The surface mount device of claim 14, further comprising an electronic device coupled with at least one of the plurality of leads and at least partially exposed through the recess.

16. The surface mount device of claim 10, wherein the insert is tapered such that an opening opposite the recess surface is larger than an opening adjacent to the recess surface.

17. A surface mount device comprising:
a casing comprising a recess formed in the casing and extending into the casing;
an inwardly tapering insert distinct from and secured to the casing, wherein the insert is generally ring-shaped and circumferentially extends about a portion of the surface of the recess such that the insert defines at least a portion of the surface of the recess, said insert further comprising tabs extending into said casing, wherein the insert comprises four adjoining segments, each of said segments having a curved shape.

* * * * *